(12) United States Patent
Jiang et al.

(10) Patent No.: US 10,197,866 B2
(45) Date of Patent: Feb. 5, 2019

(54) ARRAY SUBSTRATE AND MANUFACTURING METHOD THEREOF, DISPLAY PANEL AND MANUFACTURING METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Xuebing Jiang, Beijing (CN); Lin Lin, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 82 days.

(21) Appl. No.: 14/892,890

(22) PCT Filed: May 18, 2015

(86) PCT No.: PCT/CN2015/079201
§ 371 (c)(1),
(2) Date: Nov. 20, 2015

(87) PCT Pub. No.: WO2016/086614
PCT Pub. Date: Jun. 9, 2016

(65) Prior Publication Data
US 2016/0357041 A1    Dec. 8, 2016

(30) Foreign Application Priority Data
Dec. 5, 2014    (CN) .......................... 2014 1 0735210

(51) Int. Cl.
*H01L 27/12*      (2006.01)
*G02F 1/1339*     (2006.01)
(Continued)

(52) U.S. Cl.
CPC .......... *G02F 1/1339* (2013.01); *G02F 1/1345* (2013.01); *G02F 1/133514* (2013.01);
(Continued)

(58) Field of Classification Search
CPC ................. G02F 1/1339; G02F 1/1345; G02F 1/136286; G02F 1/133514;
(Continued)

(56) References Cited

U.S. PATENT DOCUMENTS

2007/0153167 A1* 7/2007 Jang .................. G02F 1/133512
                                                                349/110
2008/0123013 A1    5/2008 Kim
(Continued)

FOREIGN PATENT DOCUMENTS

CN    101216643 A    7/2008
CN    101303487 A    11/2008
(Continued)

OTHER PUBLICATIONS

Office Action in Chinese Patent Application No. 201410735210.5, dated Oct. 8, 2016.
(Continued)

*Primary Examiner* — Cuong Q Nguyen
(74) *Attorney, Agent, or Firm* — Brooks Kushman P.C.

(57) ABSTRACT

The present disclosure provides an array substrate, a display panel, manufacturing methods thereof and a display device. The array substrate includes a display region and a non-display region. The non-display region includes a sealant region arranged at a periphery of the display region and a peripheral region arranged at a periphery of the sealant
(Continued)

region. The array substrate further includes a plurality of signal connection lines for connecting driving lines. The signal connection lines include a first connection line, a portion of which is arranged at the peripheral region and another portion of which is arranged at the sealant region.

20 Claims, 7 Drawing Sheets

(51) Int. Cl.
*G02F 1/1335* (2006.01)
*G02F 1/1362* (2006.01)
*G02F 1/1345* (2006.01)

(52) U.S. Cl.
CPC ...... *G02F 1/136286* (2013.01); *H01L 27/124* (2013.01); *H01L 27/1262* (2013.01); *G02F 2001/136295* (2013.01); *G02F 2201/121* (2013.01); *G02F 2201/123* (2013.01)

(58) Field of Classification Search
CPC ......... G02F 2201/123; G02F 2201/121; G02F 2201/136295; H01L 27/124; H01L 27/1262; H01L 27/1222; H01L 27/1225; H01L 27/1248; H01L 27/126; H01L 27/127
See application file for complete search history.

(56) References Cited

U.S. PATENT DOCUMENTS

| 2012/0050241 A1* | 3/2012 | Huang | G02F 1/1339 345/206 |
| 2013/0120328 A1* | 5/2013 | Lee | G02F 1/1339 345/206 |
| 2015/0185520 A1* | 7/2015 | Xu | G02F 1/13306 349/38 |
| 2016/0007478 A1* | 1/2016 | Lai | H05K 3/28 361/749 |

FOREIGN PATENT DOCUMENTS

| CN | 102540525 A | 7/2012 |
| CN | 103278980 A | 9/2013 |
| CN | 103901690 A | 7/2014 |
| CN | 103941491 A | 7/2014 |
| CN | 104199216 A | 12/2014 |
| CN | 104375297 A | 2/2015 |
| CN | 204215120 U | 3/2015 |
| JP | 2006-284625 A | 10/2006 |

OTHER PUBLICATIONS

International Search Report and Written Opinion in PCT International Application No. PCT/CN2015/079201, dated Sep. 2, 2015.

* cited by examiner

ARRAY SUBSTRATE AND MANUFACTURING METHOD THEREOF, DISPLAY PANEL AND MANUFACTURING METHOD THEREOF, AND DISPLAY DEVICE

CROSS-REFERENCE TO RELATED APPLICATION

The present application is the U.S. national phase of PCT Application No. PCT/CN2015/079201 filed on May 18, 2015, which claims a priority of the Chinese Patent Application No. 201410735210.5 filed on Dec. 5, 2014, which is incorporated herein by reference in its entirety.

TECHNICAL FIELD

The present disclosure relates to the field of display technology, in particular to an array substrate and a manufacturing method thereof, a display panel and a manufacturing method thereof and a display device.

BACKGROUND

Thin film transistor liquid crystal display (TFT-LCD) mainly includes a color filter (CF) substrate, an array substrate and liquid crystals filled between the two substrates. A sealant is applied at peripheries of the two substrates so as to adhere them together and seal up the liquid crystals therebetween. Usually, the array substrate is of an area slightly greater than the color filter substrate, and corresponding room is left at its additional portion mainly for the bonding of a gate driving unit such as a gate integrated circuit (IC) and a source driving unit such as a source IC.

Referring to FIGS. 1-3, FIG. 1 is a schematic view of an existing array substrate, FIG. 2 is an enlarged view of a corner of the array substrate in FIG. 1, and FIG. 3 is a sectional view taken along a plane A-A' in FIG. 2.

As shown in FIG. 1, an array substrate 100 includes a display region 101 and a non-display region 102 arranged at a periphery of the display region. The non-display region 102 includes a sealant region 1021 arranged at a periphery of the display region 101 and a peripheral region 1022 arranged at a periphery of the sealant region 1021. A peripheral layout gate (PLG) line 202 is arranged at the peripheral region 1022. The PLG line 202 is a line for transmitting a voltage and a control signal desired for a gate electrode from a source driving unit such as a source IC to a gate driving unit such as a gate IC, so as to ensure a normal operation of the gate IC. In FIGS. 2-3, 201 represents a base substrate, 202 represents the PLG line, 203 represents a passivation layer, 204 represents a PLG connection line, and 205 represents a via-hole in the passivation layer 203. As shown in FIG. 3, the PLG connection line 204 is connected to the PLG line 202 through the via-hole 205 in the passivation layer 203, so that the PLG line 202 is connected to the driving unit (the gate driving unit or the source driving unit). As shown in FIG. 1, an existing PLG line 202 is arranged at an edge of the array substrate and easily damaged due to such factors as external force, scratch or corrosion. As a result, it is impossible for the gate driving unit to receive the desired voltage and signal, and abnormal display will occur.

SUMMARY

In view of this, the present disclosure provides an array substrate and a manufacturing method thereof, a display panel and a manufacturing method thereof and a display device, to solve the problem that the existing PLG line is easily damaged.

In order to solve the above technical problem, the present disclosure provides in one embodiment an array substrate, including a display region and a non-display region. The non-display region includes a sealant region arranged at a periphery of the display region and a peripheral region arranged at a periphery of the sealant region. The array substrate further includes a plurality of signal connection lines for connecting driving units. The signal connection lines include a first connection line, a portion of the first connection line is arranged at the peripheral region and another portion of the first connection line is arranged at the sealant region.

Alternatively, the array substrate further includes a passivation layer arranged at the non-display region, and the first connection line is arranged on the passivation layer.

Alternatively, the first connection line includes a first segment, a second segment and a third segment connected in sequence, the first segment and the third segment are arranged at the peripheral region, and the second segment is arranged at the sealant region.

Alternatively, the first connection line includes a first subsection and a second subsection spaced apart from each other, a portion of the first subsection and a portion of the second subsection are arranged at the peripheral region, and another portion of the first subsection and another portion of the second subsection are arranged at the sealant region.

Alternatively, the array substrate further includes a pixel electrode layer arranged at the display region, and the first connection line is arranged at a layer, and made of a material, identical to the pixel electrode layer.

Alternatively, the signal connection lines further include a second connection line arranged at the peripheral region and connected in parallel to the first connection line.

Alternatively, the array substrate further includes a plurality of conductive layers arranged at the display region, and the second connection line is arranged at a layer, and made of a material, identical to one of the conductive layers.

Alternatively, the conductive layers include a gate metal layer and a source-drain metal layer, the second connection line is arranged at a layer, and made of a material, identical to the gate metal layer or source-drain metal layer, and the second connection line is connected in parallel to the first connection line through a via-hole.

The present disclosure further provides in one embodiment a display panel including the above-mentioned array substrate, a color filter substrate, and a sealant arranged between the array substrate and the color filter substrate.

Alternatively, the array substrate further includes a passivation layer arranged at the non-display region, and the first connection line is arranged on the passivation layer.

Alternatively, the first connection line includes a first subsection and a second subsection spaced apart from each other, a portion of the first subsection and a portion of the second subsection are arranged at a peripheral region, and another portion of the first subsection and another portion of the second subsection are arranged at a sealant region, the color filter substrate further includes a display region, a sealant region arranged at a periphery of the display region and third connection lines arranged at the sealant region, and each of the third connection lines connects the first subsection and the second subsection of the first connection line through conductive metallic balls in the sealant.

Alternatively, the array substrate further includes a pixel electrode layer arranged at the display region of the array substrate, and the first connection line is arranged at a layer, and made of a material, identical to the pixel electrode layer.

Alternatively, the color filter substrate further includes a common electrode layer at the display region of the color filter substrate, and the third connection line is arranged at a layer, and made of a material, identical to the common electrode layer.

The present disclosure provides in one embodiment a method for manufacturing an array substrate. The array substrate includes a display region and a non-display region, and the non-display region includes a sealant region arranged at a periphery of the display region and a peripheral region arranged at a periphery of the sealant region. The method includes a step of forming signal connection lines for connecting driving units. The signal connection lines include a first connection line, a portion of the first connection line is arranged at the peripheral region and another portion of the first connection line is arranged at the sealant region.

Alternatively, before forming the first connection line, the method further includes: forming a second connection line arranged at the peripheral region; forming a passivation layer arranged at the non-display region; and forming a via-hole through the passivation layer. The step of forming the first connection line includes forming the first connection line and a pixel electrode layer at the display region by a single patterning process, and the first connection line is connected in parallel to the second connection line through the via-hole.

Alternatively, the first connection line includes a first segment, a second segment and a third segment connected in sequence, the first segment and the third segment are arranged at the peripheral region, and the second segment is arranged at the sealant region.

Alternatively, the first connection line includes a first subsection and a second subsection spaced apart from each other, a portion of the first subsection and a portion of the second subsection are arranged at the peripheral region, and another portion of the first subsection and another portion of the second subsection are arranged at the sealant region.

The present disclosure provides in one embodiment a method for manufacturing a display panel, including steps of forming an array substrate using the above-mentioned method, and forming a color filter substrate.

Alternatively, the first connection line includes a first subsection and a second subsection spaced apart from each other, a portion of the first subsection and a portion of the second subsection are arranged at a peripheral region, and another portion of the first subsection and another portion of the second subsection are arranged at a sealant region, the step of forming the color filter substrate includes forming third connection lines at a sealant region of the color filter substrate. After forming the array substrate and the color filter substrate, the method further includes adhering the array substrate to the color filter substrate with a sealant containing conductive metallic balls, and each of the third connection lines connects the first subsection and the second subsection of the first connection line through the conductive metallic balls.

The present disclosure further provides in one embodiment a display device including the above-mentioned display panel.

The above technical solutions of the present disclosure have following benefits. A portion of the first connection line for connecting the driving units is arranged at the sealant region, and another portion thereof is arranged at the peripheral region. After the array substrate is arranged opposite to the color filter substrate to form a cell, the first connection line at the sealant region may be covered by the sealant at the sealant region. As a result, it is able to decrease the possibility of damaging the first connection line, thereby to reduce the phenomenon of abnormal display of the display device including the array substrate due to the damaged first connection line.

DETAILED DESCRIPTION

In order to make the technical problem to be solved, the technical solutions and the advantages of the present disclosure more apparent, the present disclosure will be described hereinafter in conjunction with the drawings and embodiments.

Figure 1:
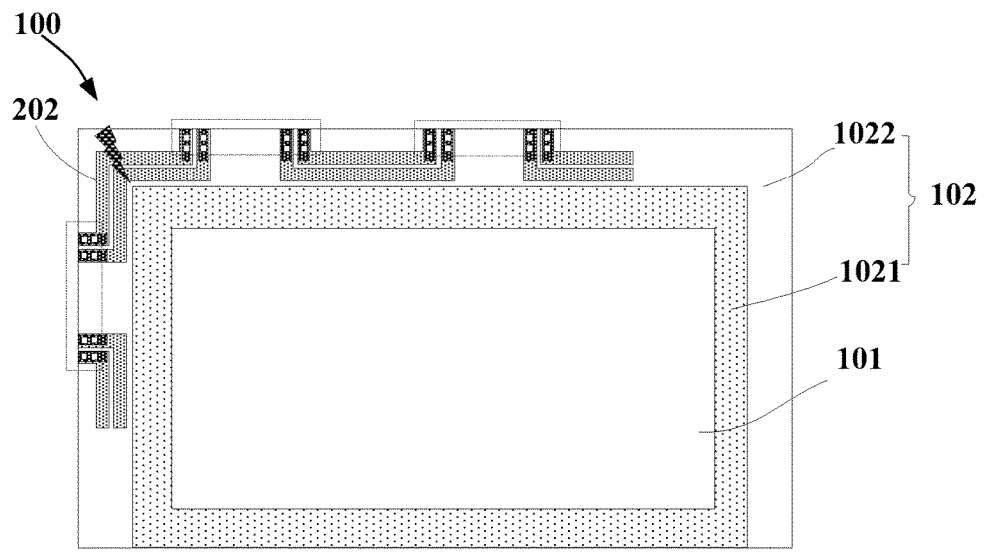
FIG. 1 is a schematic view of an existing array substrate.
Figure 2:
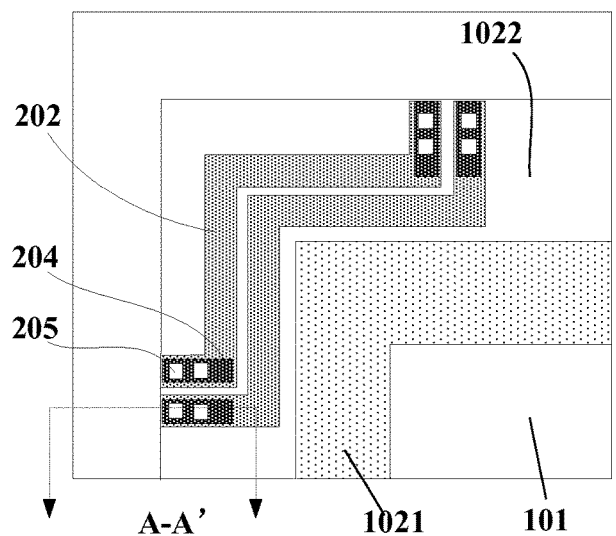
FIG. 2 is an enlarged view of a corner of the array substrate in FIG. 1.
Figure 3:
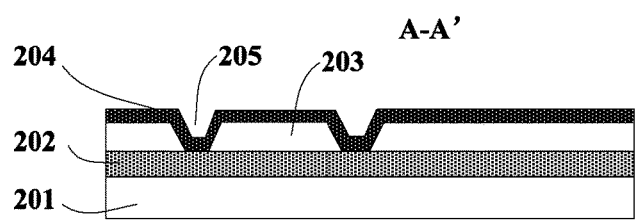
FIG. 3 is a sectional view taken along a plane A-A' in FIG. 2.
Figure 4:
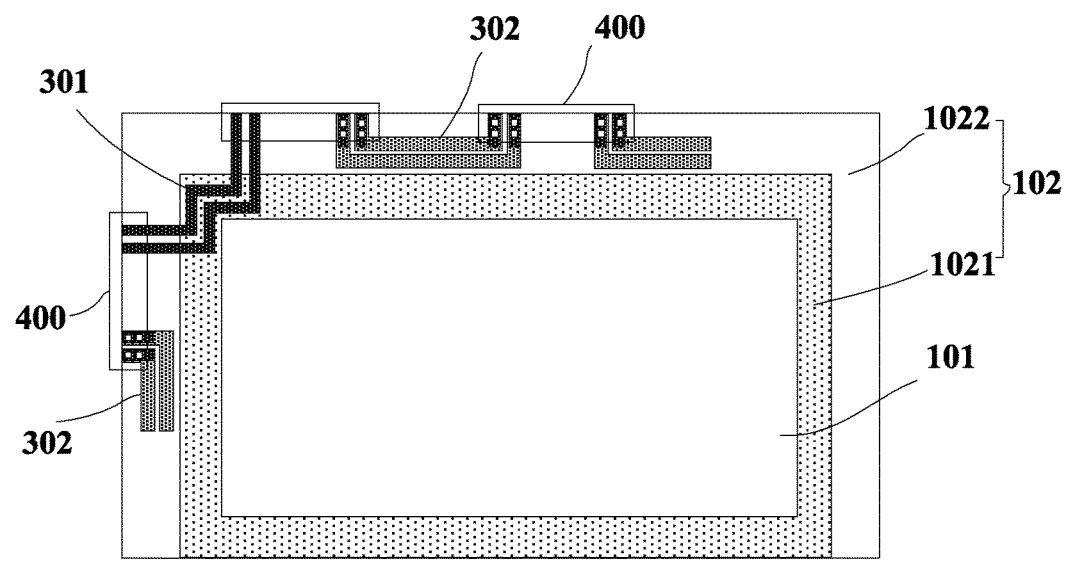
FIG. 4 is a schematic view of an array substrate according to a first embodiment of the present disclosure.

Referring to FIG. 4, which is a schematic view showing an array substrate according to a first embodiment of the present disclosure, the array substrate includes a display region 101 and a non-display region 102. The non-display region 102 includes a sealant region 1021 arranged at a periphery of the display region 101 and a peripheral region 1022 arranged at a periphery of the sealant region 1021. A sealant is arranged at the sealant region 1021, so that the array substrate and a color filter substrate may be arranged opposite to each other to form a cell. The array substrate further includes a plurality of signal connection lines for connecting driving units 400. The signal connection lines include a first connection line 301. A portion of the first connection line 301 is arranged at the peripheral region 1022 and another portion of the first connection line 301 is arranged at the sealant region 1021.

The driving units 400 include gate driving units and source driving units. The signal connection line may be configured to connect one gate driving unit and one source driving unit, or connect two source driving units or two gate driving units. Generally, one driving unit 400 arranged at an upper side of the array substrate is the source driving unit, while one driving unit 400 arranged at a left side of the array substrate is the gate driving unit.

Generally, signals transmitted via the signal connection lines include Start Vertical (STV, i.e., a start signal for one frame), a Clock Pulse Vertical (CPV, i.e., a start signal for one row), an Output Enable (OE), a VGH (i.e., a high voltage signal applied to a TFT), and a VGL (a low voltage signal applied to the TFT), and so on.

Since a portion of the first connection line 301 for connecting the driving units is arranged at the sealant region 1021, thus, the first connection line 301 at the sealant region 1021 may be covered by the sealant at the sealant region 1021 after the array substrate is arranged opposite to the color filter substrate to form a cell. As a result, it is able to decrease the possibility of damaging the first connection line 301, thereby to reduce the phenomenon of abnormal display of the display device including the array substrate due to the damaged first connection line 301.

Generally, the array substrate further includes a passivation layer, and alternatively, the first connection line 301 is arranged on the passivation layer, so as to be connected to the driving units 400 conveniently.

In addition, the array substrate includes a pixel electrode layer arranged at the display region 101. Alternatively, the first connection line 301 may be arranged at a layer, and made of a material, identical to the pixel electrode layer, i.e., the first connection line 301 and the pixel electrode layer may be formed by a single patterning process, so as to reduce process steps and improve the production efficiency. Of course, in some other embodiments of the present disclosure, the first connection line 301 may also be formed by a separate patterning process.

Alternatively, in some other embodiments of the present disclosure, the first connection line 301 may also be arranged under the passivation layer and connected to the driving units 400 through a via-hole.

As shown in FIG. 4, apart from the first connection line 301, the signal connection lines for connecting the driving units further include a fourth connection line 302 arranged at the peripheral region. The signal connection line configured to connect the source driving unit and the gate driving unit is the first connection line 301 (a portion of which is arranged at the sealant region 1021), while the signal connection line adopted at other position is the fourth connection line 302 at the peripheral region.

The array substrate further includes a plurality of conductive layers arranged at the display region 101, and the fourth connection line 302 may be arranged at a layer, and made of a material, identical to one of the conductive layers. The conductive layer may be a gate metal layer or a source-drain metal layer. The fourth connection line 302 is connected to the driving unit 400 through a via-hole.

As shown in FIG. 4, merely the first connection line 301 (a portion of which is arranged at the sealant region 1021) may be protected, while it is difficult to effectively protect the fourth connection line 302 at the peripheral region from being damaged due to such factors as external force, scratch or corrosion.

Figure 5:
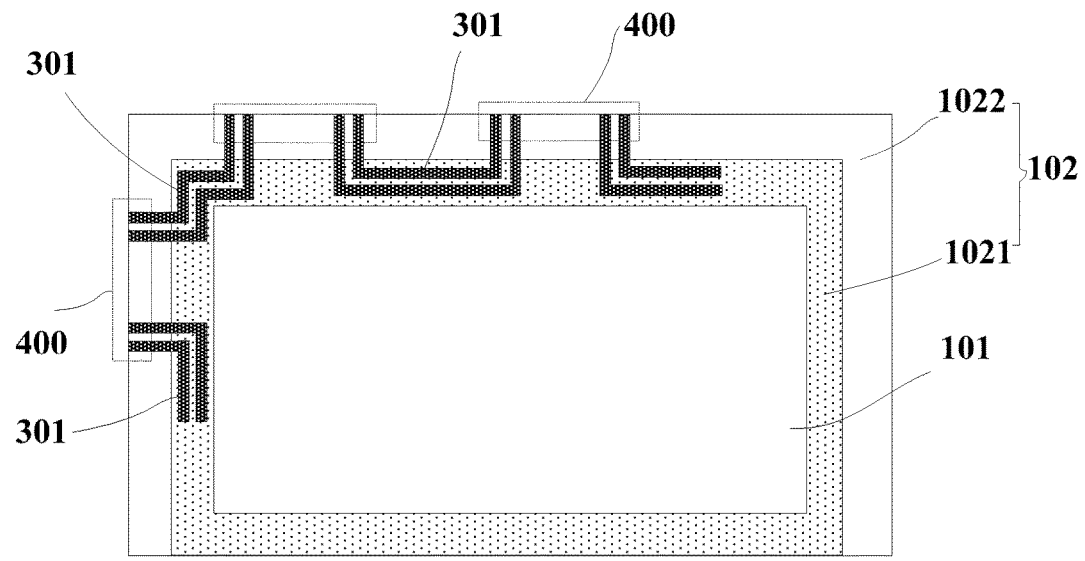
FIG. 5 is a schematic view of an array substrate according to a second embodiment of the present disclosure.

Referring to FIG. 5, which is a schematic view showing an array substrate according to a second embodiment of the present disclosure, all the signal connection lines are the first connection lines 301. With this structure, all the signal connection lines may be protected. In addition, at this time a small area is occupied by the signal connection lines at the peripheral region 1022, so it is able to reduce a size of the peripheral region 1022 of the array substrate, thereby to provide a narrow bezel.

Figure 6:
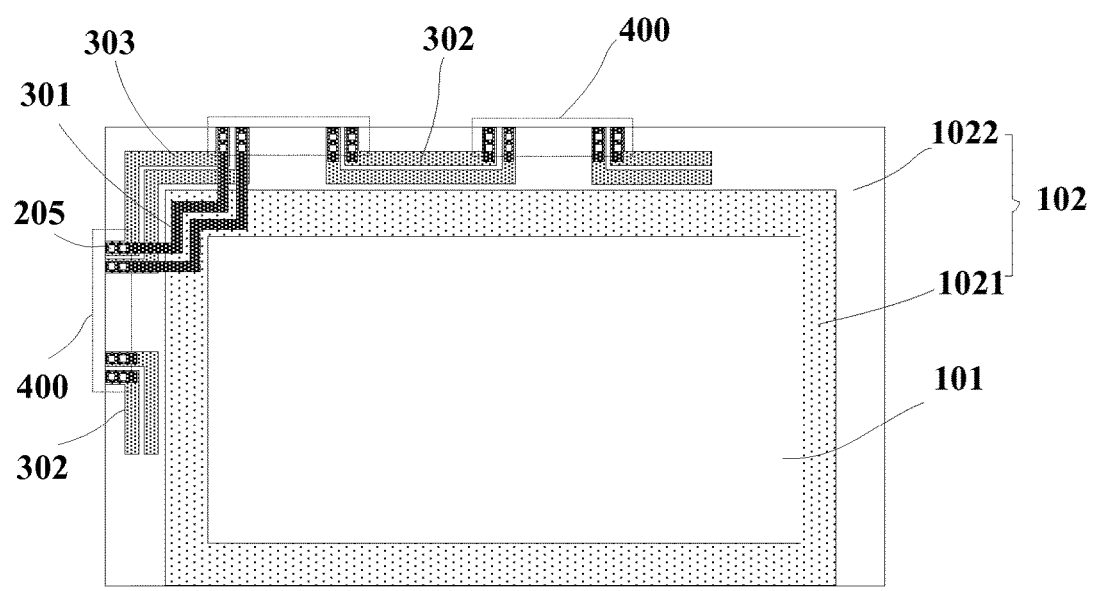
FIG. 6 is a schematic view of an array substrate according to a third embodiment of the present disclosure.

Referring to FIG. 6, which is a schematic view showing an array substrate according to a third embodiment of the present disclosure, the array substrate differs from that in FIG. 4 in that, the signal connection lines further include a second connection line 303 arranged at the peripheral region and connected in parallel to the first connection line 301.

The array substrate further includes a passivation layer and a plurality of conductive layers arranged at the display region. Alternatively, the second connection line 303 may be arranged at a layer, and made of a material, identical to one of the conductive layers.

Alternatively, the conductive layers include a gate metal layer and a source-drain metal layer; the second connection line 303 may be arranged at a layer, and made of a material, identical to the gate metal layer or the source-drain metal layer. The second connection line 303 is connected in parallel to the first connection line 301 through a via-hole 205.

With this structure, double assurance for signal transmission is provided, i.e., even if the second connection line 303 is damaged, the signal can still be transmitted normally via the first connection line 301 connected in parallel to the second connection line 303; even if the first connection line 301 has a failure, the signal can still be transmitted normally via the second connection line 303 connected in parallel to the first connection line 301.

As shown in FIG. 6, merely the signal connection line configured to connect the source driving unit and the gate driving unit is in form of the first connection line 301 and the second connection line 303 connected in parallel to each other, while the signal connection line at other position is the fourth connection line 302 at the peripheral region.

Figure 7:
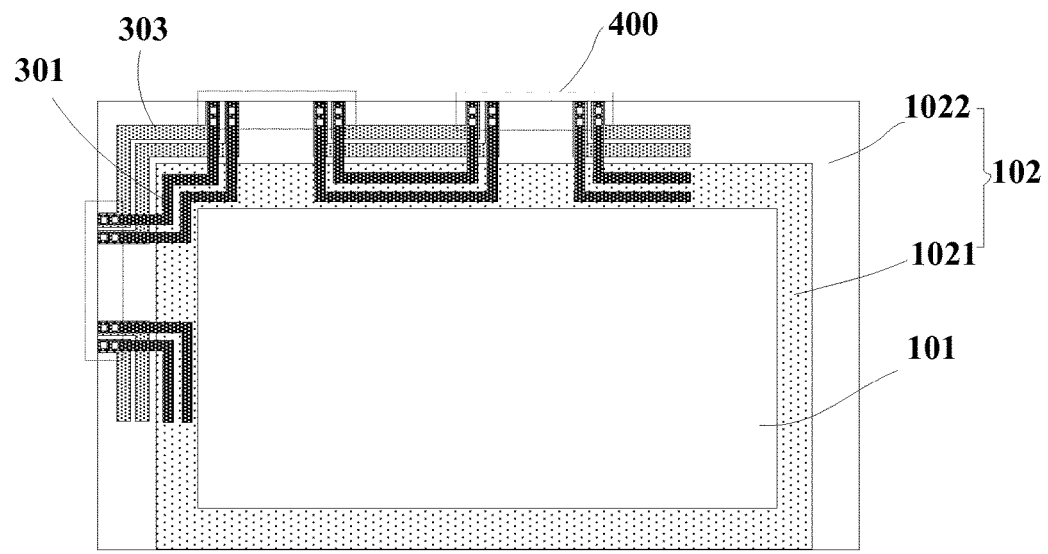
FIG. 7 is a schematic view of an array substrate according to a fourth embodiment of the present disclosure.

Referring to FIG. 7, which is a schematic view showing an array substrate according to a fourth embodiment of the present disclosure, each of the signal connection lines is in form of the first connection line 301 and the second connection line 303 connected in parallel to each other.

The present disclosure further provides in one embodiment a display panel including an array substrate and a color filter substrate. The array substrate may be any one of the array substrates of the above-mentioned embodiments.

Figure 8:
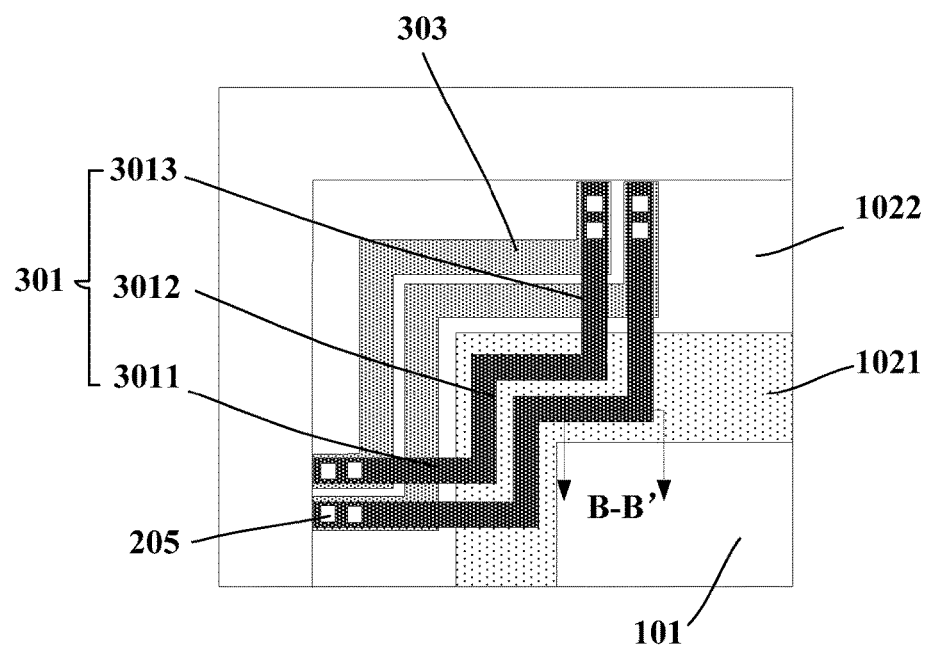
FIG. 8 is a schematic view of a display panel according to a fifth embodiment of the present disclosure.
Figure 9:
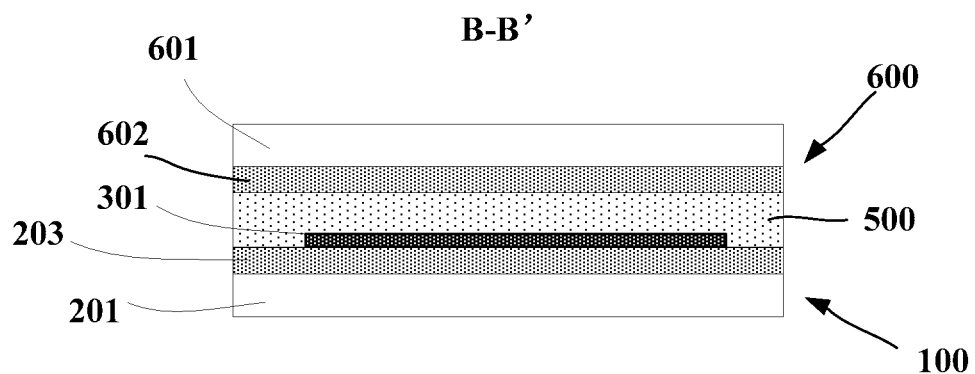
FIG. 9 is a sectional view taken along a plane B-B' in FIG. 8.

Referring to FIGS. 8-9, FIG. 8 is a schematic view showing a display panel according to a fifth embodiment of the present disclosure and FIG. 9 is a sectional view taken along a plane B-B' in FIG. 8, the display panel includes an array substrate 100, a color filter substrate 600, and a sealant 500 arranged therebetween. The array substrate 100 includes a display region 101 and a non-display region. The non-display region includes a sealant region 1021 arranged at a periphery of the display region 101 and a peripheral region 1022 arranged at a periphery of the sealant region 1021. The sealant 500 is arranged at the sealant region 1021, so that the array substrate 100 and the color filter substrate 600 may be arranged opposite to each other to form a cell. The array substrate further includes a plurality of signal connection lines for connecting driving units 400. The signal connection lines include a first connection line 301. The first connection line 301 includes a first segment 3011, a second segment 3012 and a third segment 3013 which are connected in sequence. The first segment 3011 and the third segment 3013 are arranged at the peripheral region 1022 of the array substrate, and the second segment 3012 is arranged at the sealant region 1021 of the array substrate.

As shown in FIG. 9, the first connection line 301 at the sealant region 1021 may be covered by the sealant 500, so as to be protected from being damaged due to such factors as external force, scratch or corrosion. In FIG. 9, 201 represents a base substrate of the array substrate, 203 represents the passivation layer, 301 represents the first connection line, 601 represents a base substrate of the color filter substrate, and 602 represents a planarization layer.

In this embodiment, the signal connection lines further include a second connection line 303 arranged at the peripheral region 1022 and connected with the first connection line 301. The second connection line 303 is connected in parallel to the first connection line 301 through a via-hole 205.

Figure 10:
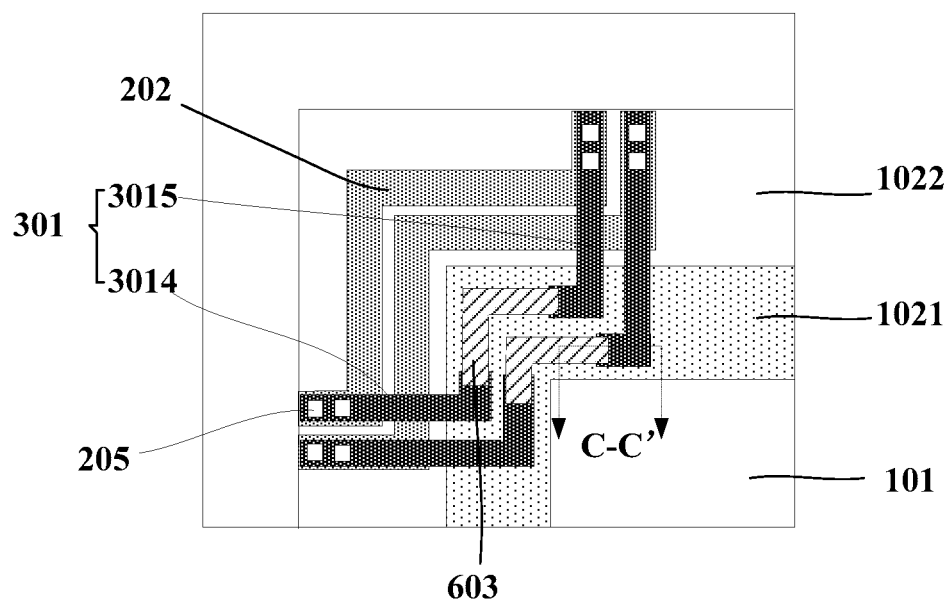
FIG. 10 is a schematic view of a display panel according to a sixth embodiment of the present disclosure.
Figure 11:
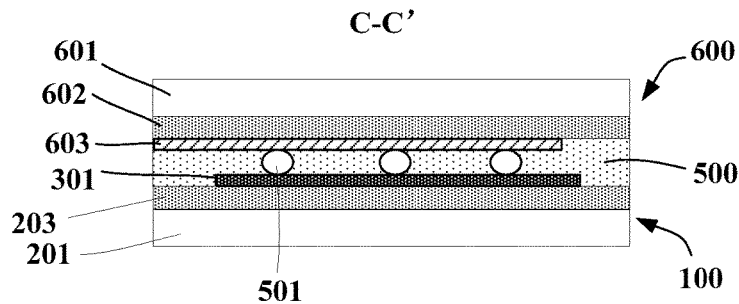
FIG. 11 is a sectional view taken along a plane C-C' in FIG. 10.

Referring to FIGS. 10-11, FIG. 10 is a schematic view showing a display panel according to a sixth embodiment and FIG. 11 is a sectional view taken along a plane C-C' in FIG. 10, in this embodiment, the display panel includes an array substrate 100, a color filter substrate 600, and a sealant 500 arranged therebetween. The array substrate 100 includes a display region (which is also referred as a first display region) 101 and a non-display region. The non-display region includes a sealant region (which is also referred as a first sealant region) 1021 arranged at a periphery of the display region 101 and a peripheral region 1022 arranged at a periphery of the sealant region 1021. The sealant 500 is arranged at the sealant region 1021, so that the array substrate 100 and the color filter substrate 600 may be arranged opposite to each other to form a cell. The array substrate further includes a plurality of signal connection lines for connecting driving units 400. The signal connection lines include a first connection line 301. The first connection line 301 includes a first subsection 3014 and a second subsection 3015 spaced apart from each other. A portion of the first subsection 3014 and a portion of the second subsection 3015 are arranged at the peripheral region 1022, and another portion of the first subsection 3014 and another portion of the second subsection 3015 are arranged at the sealant region 1021.

The color filter substrate 600 includes a second display region, a second sealant region arranged at a periphery of the second display region, and third connection lines 603 arranged at the second sealant region. Each of the third connection lines 603 connects the first subsection 3014 and the second subsection 3015 of the first connection line 301 through conductive metallic balls 501 in the sealant 500.

With this structure, the conductive metallic balls 501 in the sealant 500 may enable the first connection line 301 arranged at the array substrate 100 to be electrically connected to the third connection line 603 arranged at the color filter substrate 600. A signal applied to the second subsection 3015 of the first connection line 301 may be transmitted to the color filter substrate 600 through the conductive metallic balls 501 and then transmitted back to the first subsection 3014 at the array substrate 100 through the conductive metallic balls 501.

The conductive metallic balls 501 may be conductive golden balls.

In FIG. 11, 201 represents a base substrate of the array substrate, 601 represents a base substrate of the color filter substrate, and 602 represents a planarization layer. Alternatively, the array substrate 100 further includes a passivation layer 203 arranged at its non-display region, and the first connection line 301 is arranged on the passivation layer 203. The array substrate further includes a pixel electrode layer arranged at its display region, and alternatively, the first connection line 301 is arranged at a layer, and made of a material, identical to the pixel electrode layer.

When the display panel is of a twisted nematic (TN) type, the color filter substrate 600 further includes a common electrode layer arranged at its display region. Alternatively, the third connection line 603 may be arranged at a layer, and made of a material, identical to the common electrode layer.

The present disclosure further provides in one embodiment a display device including the above-mentioned display panel.

The present disclosure further provides in one embodiment a method for manufacturing an array substrate. The array substrate includes a display region and a non-display region, and the non-display region includes a sealant region arranged at a periphery of the display region and a peripheral region arranged at a periphery of the sealant region. The method includes a step of forming signal connection lines for connecting driving units. The signal connection lines include a first connection line. A portion of the first connection line is arranged at the peripheral region and another portion of the first connection line is arranged at the sealant region.

Alternatively, before forming the first connection line, the method further includes: forming a second connection line arranged at the peripheral region, forming a passivation layer arranged at the non-display region, and forming a via-hole through the passivation layer.

The step of forming the first connection line includes: forming the first connection line and a pixel electrode layer at the display region by a single patterning process, with the first connection line being connected in parallel to the second connection line through the via-hole.

The present disclosure further provides in one embodiment a method for manufacturing a display panel, including steps of forming an array substrate and forming a color filter substrate. The array substrate includes a display region and a non-display region, and the non-display region includes a sealant region arranged at a periphery of the display region and a peripheral region arranged at a periphery of the sealant region. The step of forming the array substrate includes: forming signal connection lines for connecting driving units. The signal connection lines include a first connection line. A portion of the first connection line is arranged at the peripheral region and another portion of the first connection line is arranged at the sealant region.

Alternatively, the step of forming the first connection line includes forming the first connection line and a pixel electrode layer arranged at the display region by a single patterning process. The first connection line includes a first subsection and a second subsection spaced apart from each other. A portion of the first subsection and a portion of the second subsection are arranged at the peripheral region, and another portion of the first subsection and another portion of the second subsection are arranged at the sealant region.

The step of forming the color filter substrate includes forming third connection lines at a sealant region of the color filter substrate.

After forming the array substrate and the color filter substrate, the method further includes adhering the array substrate to the color filter substrate with a sealant containing conductive metallic balls, and each of the third connection lines connecting the first subsection and the second subsection of the first connection line through the conductive metallic balls.

Figure 12:
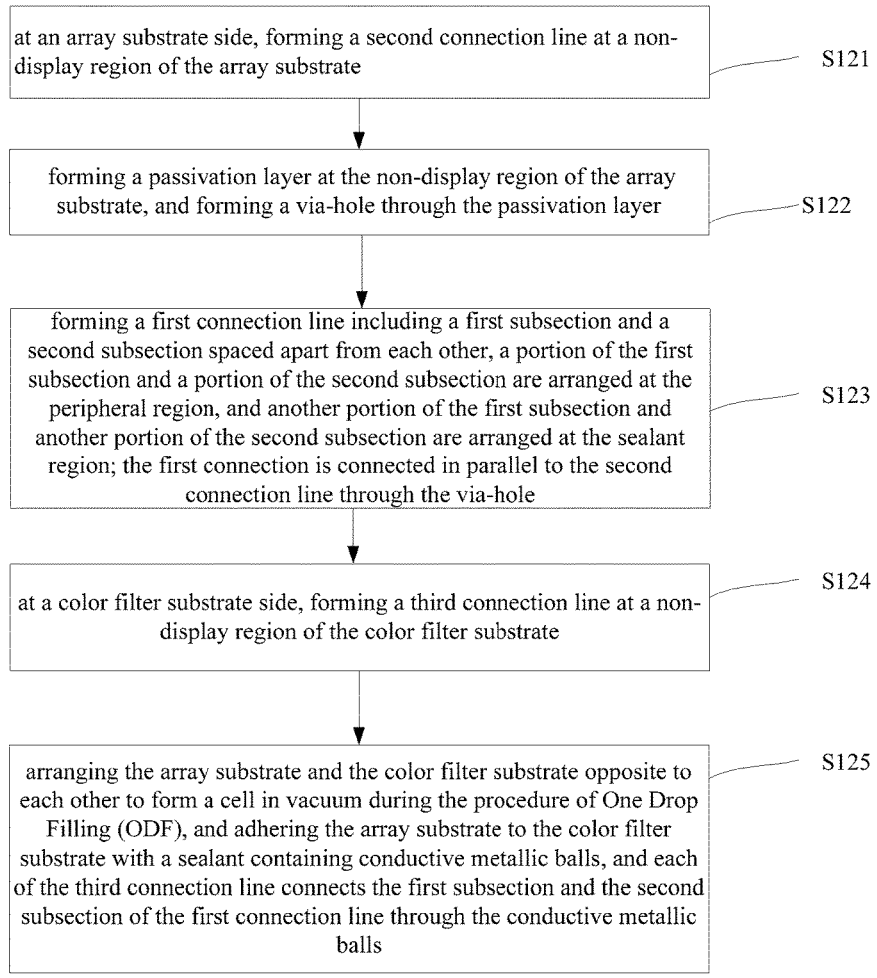
FIG. 12 is a flow chart of a method for manufacturing a display panel according to a seventh embodiment of the present disclosure.

Referring to FIG. 12, which is a flow chart of a method for manufacturing a display panel according to a seventh embodiment of the present disclosure, the method includes the following steps.

Step S121: at an array substrate side, forming a second connection line at a non-display region of the array substrate. The non-display region of the array substrate includes a sealant region and a peripheral region arranged at a periphery of the sealant region, and the second connection line is arranged at the peripheral region.

Step S122: forming a passivation layer at the non-display region of the array substrate, and forming a via-hole through the passivation layer.

Step S123: forming a first connection line on the passivation layer. The first connection line includes a first subsection and a second subsection spaced apart from each other, a portion of the first subsection and a portion of the second subsection are arranged at the peripheral region, and another portion of the first subsection and another portion of the second subsection are arranged at the sealant region. The first connection is connected in parallel to the second connection line through the via-hole.

The first connection line and the pixel electrode layer at the display region of the array substrate may be formed by a single patterning process.

Step S124: at a color filter substrate side, forming a third connection line at a non-display region of the color filter substrate. When the display panel is of a TN type, the third connection line and the common electrode layer on the color filter substrate by a single patterning process.

Step S125: arranging the array substrate and the color filter substrate opposite to each other to form a cell in vacuum during the procedure of One Drop Filling (ODF), and adhering the array substrate to the color filter substrate with a sealant. The sealant contains conductive metallic balls, and each of the third connection line connects the first subsection and the second subsection of the first connection line through the conductive metallic balls in the sealant.

With this structure, the conductive metallic balls in the sealant may enable the first connection line arranged at the array substrate to be electrically connected to the third connection line arranged at the color filter substrate. A signal applied to the second subsection of the first connection line may be transmitted to the color filter substrate through the conductive metallic balls and then transmitted back to the first subsection at the array substrate through the conductive metallic balls.

In this embodiment, the signal connection lines for transmitting the signals may be arranged at both the array substrate and the color filter substrate.

According to this embodiment, a portion of the first connection line at the array substrate is covered by the sealant, so it may be protected effectively. In addition, the array substrate include the first connection line and the second connection line connected in parallel to each other, so it is able to provide double assurance.

Figure 13:
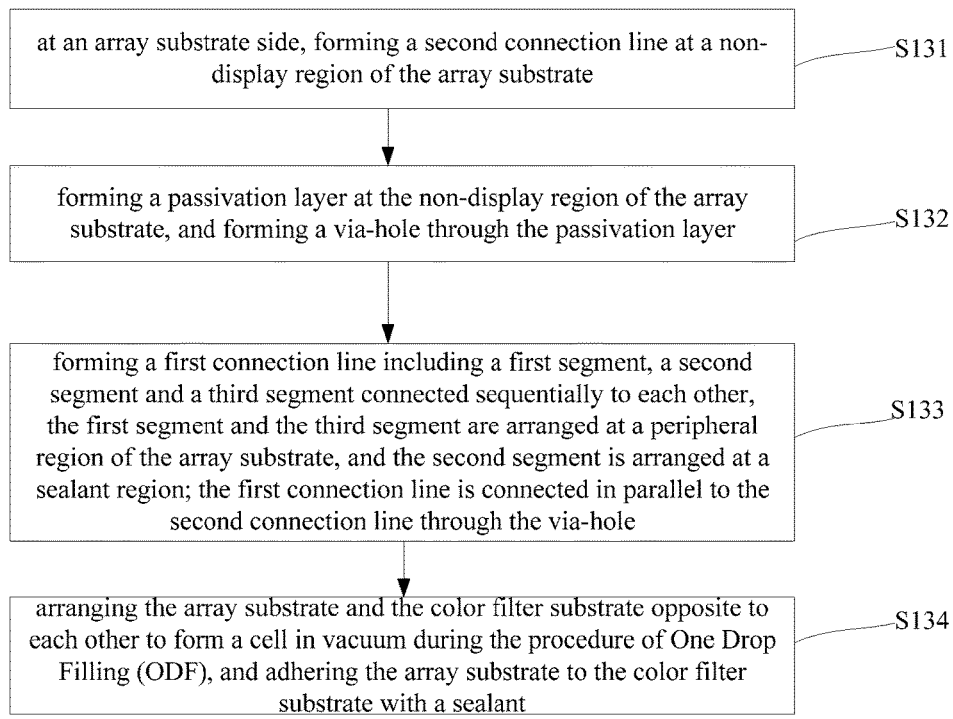
FIG. 13 is a flow chart of a method for manufacturing a display panel according to an eighth embodiment of the present disclosure.

Referring to FIG. 13, which is a flow chart of a method for manufacturing a display panel according to an eighth embodiment of the present disclosure, the method includes the following steps.

Step S131: at an array substrate side, forming a second connection line at a non-display region of the array substrate. The non-display region of the array substrate includes a sealant region and a peripheral region arranged at a periphery of the sealant region, and the second connection line is arranged at the peripheral region.

Step S132: forming a passivation layer at the non-display region of the array substrate, and forming a via-hole through the passivation layer.

Step S133: forming a first connection line on the passivation layer. The first connection line includes a first segment, a second segment and a third segment connected in sequence. The first segment and the third segment are arranged at a peripheral region of the array substrate, and the second segment is arranged at a sealant region of the array substrate. The first connection line is connected in parallel to the second connection line through the via-hole.

The first connection line and the pixel electrode layer at the display region of the array substrate may be formed by a single patterning process.

Step S134: arranging the array substrate and the color filter substrate opposite to each other to form a cell in vacuum during the procedure of One Drop Filling (ODF), and adhering the array substrate to the color filter substrate with a sealant.

In this embodiment, the signal connection lines for transmitting signals are merely arranged at the array substrate.

According to this embodiment, a portion of the first connection line at the array substrate is covered by the sealant, so it may be protected effectively. In addition, the array substrate include the first connection line and the second connection line connected in parallel to each other, so it is able to provide double assurance.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising a first display region and a non-display region, the non-display region comprising a first sealant region arranged at a periphery of the first display region and a peripheral region arranged at a periphery of the first sealant region; wherein the array substrate further comprises a plurality of driving units in the peripheral region and a plurality of signal connection lines for connecting the plurality of driving units, and the signal connection lines comprise a first connection line; a portion of the first connection line is arranged in the peripheral region and another portion of the first connection line is arranged in the first sealant region, wherein two ends of the first connection line are connected with two of the plurality of driving units, respectively.

2. The array substrate according to claim 1, further comprising a passivation layer arranged in the non-display region; wherein the first connection line is arranged on the passivation layer.

3. The array substrate according to claim 1, wherein the first connection line comprises a first segment, a second segment and a third segment connected in sequence; the first segment and the third segment are arranged in the peripheral region, and the second segment is arranged in the first sealant region.

4. The array substrate according to claim 1, wherein the first connection line comprises a first subsection and a second subsection spaced apart from each other; a portion of the first subsection and a portion of the second subsection are arranged in the peripheral region, and another portion of the first subsection and another portion of the second subsection are arranged in the first sealant region.

5. The array substrate according to claim 1, further comprising a pixel electrode layer arranged in the first display region; wherein the first connection line is made of a material identical to the material of the pixel electrode layer, and the first connection line and the pixel electrode layer are in a same layer.

6. The array substrate according to claim 1, wherein the signal connection lines further comprise a second connection line arranged in the peripheral region, the second connection line and the first connection line are connected in parallel.

7. The array substrate according to claim 6, further comprising a plurality of conductive layers arranged in the first display region; wherein the second connection line is made of a material identical to the material of one of the conductive layers, and the second connection line and the one of the conductive layers are in a same layer.

8. The array substrate according to claim 7, wherein the conductive layers comprise a gate metal layer and a source-drain metal layer, the second connection line is made of a material identical to the material of the gate metal layer or source-drain metal layer, the second connection line and one of the gate metal layer and the source-drain metal layer are in a same layer, and the second connection line and the first connection line are connected in parallel through a via-hole.

9. A display panel, comprising:
   the array substrate according to claim 1;
   a color filter substrate; and
   a sealant arranged between the array substrate and the color filter substrate.

10. The display panel according to claim 9, wherein the array substrate further comprises a passivation layer arranged in the non-display region, and the first connection line is arranged on the passivation layer.

11. The display panel according to claim 9, wherein the array substrate further comprises a first subsection and a second subsection unconnected from each other, a portion of the first subsection and a portion of the second subsection are arranged in the peripheral region, and another portion of the first subsection and another portion of the second subsection are arranged in the first sealant region;
   the color filter substrate further comprises:
   a second display region;
   a second sealant region arranged at a periphery of the second display region of the color filter substrate; and
   a third connection line arranged in the second sealant region of the color filter substrate;
   wherein the third connection line connects the first subsection and the second subsection through conductive metallic balls in the sealant, thereby forming the first connection line.

12. The display panel according to claim 9, wherein the array substrate further comprises a pixel electrode layer arranged in the first display region of the array substrate, and the first connection line is made of a material identical to the material of the pixel electrode layer, and the first connection line and the pixel electrode layer are in a same layer.

13. The display panel according to claim 11, wherein the color filter substrate further comprises a common electrode layer in the second display region of the color filter substrate, and the third connection line is made of a material identical to the material of the common electrode layer, and the third connection line and the common electrode layer are in a same layer.

14. A method for manufacturing an array substrate, the array substrate comprising a first display region and a non-display region, the non-display region comprising a first sealant region arranged at a periphery of the first display region and a peripheral region arranged at a periphery of the first sealant region, the array substrate further comprising a plurality of driving units in the peripheral region and a plurality of signal connection lines for connecting the plurality of driving units, the method comprising a step of forming the signal connection lines for connecting the plurality of driving units; wherein the signal connection lines comprise a first connection line; a portion of the first connection line is arranged in the peripheral region and another portion of the first connection line is arranged in the first sealant region, and two ends of the first connection line are connected with two of the plurality of driving units, respectively.

15. The method according to claim 14, wherein before forming the first connection line, the method further comprises:
   forming a second connection line arranged in the peripheral region;
   forming a passivation layer arranged in the non-display region; and
   forming a via-hole through the passivation layer;
   the step of forming the first connection line comprises:
   forming the first connection line and a pixel electrode layer in the first display region by a single patterning process; wherein the first connection line is connected in parallel to the second connection line through the via-hole.

16. The method according to claim 14, wherein the first connection line comprises a first segment, a second segment and a third segment connected in sequence, the first segment and the third segment are arranged in the peripheral region, and the second segment is arranged in the first sealant region.

17. The method according to claim 14, wherein the first connection line comprises a first subsection and a second subsection spaced apart from each other, a portion of the first subsection and a portion of the second subsection are arranged in the peripheral region, and another portion of the first subsection and another portion of the second subsection are arranged in the first sealant region.

18. A method for manufacturing a display panel, comprising:
   forming an array substrate using the method according to claim 14; and
   forming a color filter substrate;
   wherein the array substrate comprises a first subsection and a second subsection unconnected from each other, a portion of the first subsection and a portion of the second subsection are arranged in the peripheral region, and another portion of the first subsection and another portion of the second subsection are arranged in the first sealant region;
   the step of forming the color filter substrate comprises forming a third connection line in a second sealant region of the color filter substrate;
   after forming the array substrate and the color filter substrate, the method further comprises adhering the array substrate to the color filter substrate with a sealant containing conductive metallic balls; wherein the third connection line connects the first subsection and the second subsection through the conductive metallic balls, thereby forming the first connection line.

19. A display device comprising the display panel according to claim 9.

20. The array substrate according to claim 1, wherein each of signal connection lines is entirely within the non-display region.

* * * * *